(12) United States Patent
Otagaki et al.

(10) Patent No.: US 10,509,523 B2
(45) Date of Patent: *Dec. 17, 2019

(54) METHODS AND APPARATUS FOR A CAPACITIVE PRESSURE SENSOR

(71) Applicant: SEMICONDUCTOR COMPONENTS INDUSTRIES, LLC, Phoenix, AZ (US)

(72) Inventors: Takayasu Otagaki, Ota (JP); Kensuke Goto, Ashikaga (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/291,509

(22) Filed: Mar. 4, 2019

(65) Prior Publication Data

US 2019/0196624 A1    Jun. 27, 2019

Related U.S. Application Data

(63) Continuation of application No. 15/647,438, filed on Jul. 12, 2017.

(51) Int. Cl.

| | |
|---|---|
| *G06F 3/044* | (2006.01) |
| *G06F 3/0487* | (2013.01) |
| *G06F 3/041* | (2006.01) |
| *H03K 17/96* | (2006.01) |
| *H03K 17/955* | (2006.01) |
| *H03K 17/975* | (2006.01) |

(52) U.S. Cl.
CPC ............ *G06F 3/044* (2013.01); *G06F 3/0414* (2013.01); *G06F 3/0416* (2013.01); *H03K 17/955* (2013.01); *H03K 17/962* (2013.01); *H03K 17/975* (2013.01); *G06F 2203/04103* (2013.01); *G06F 2203/04105* (2013.01); *H03K 2217/9651* (2013.01)

(58) Field of Classification Search
USPC ..................................... 345/173–174; 73/724
See application file for complete search history.

(56) References Cited

U.S. PATENT DOCUMENTS

| | | |
|---|---|---|
| 2010/0107770 A1 | 5/2010 | Serban |
| 2011/0018556 A1 | 1/2011 | Le |
| 2012/0081332 A1 | 4/2012 | Atsuta |
| 2014/0203953 A1 | 7/2014 | Moser |
| 2016/0011691 A1* | 1/2016 | Shinkai .................. G06F 3/044 345/174 |

(Continued)

FOREIGN PATENT DOCUMENTS

JP      2008204812 A      9/2008

*Primary Examiner* — Deeprose Subedi
(74) *Attorney, Agent, or Firm* — The Noblitt Group, PLLC; Hettie L. Haines

(57) ABSTRACT

Various embodiments of the present technology may provide methods and apparatus for a capacitive pressure sensor configured to detect firm pressure to a sensing surface. The capacitive pressure sensor may include a first substrate and a second substrate, wherein at least one of the first and second substrate is configured to deform when firm pressure is applied. The deformation of the sensor may either create a gap between the substrates or eliminate a gap between the substrates. The deformation may be interpreted as firm pressure to the sensing surface.

19 Claims, 13 Drawing Sheets

(56) References Cited

U.S. PATENT DOCUMENTS

Figure 1:
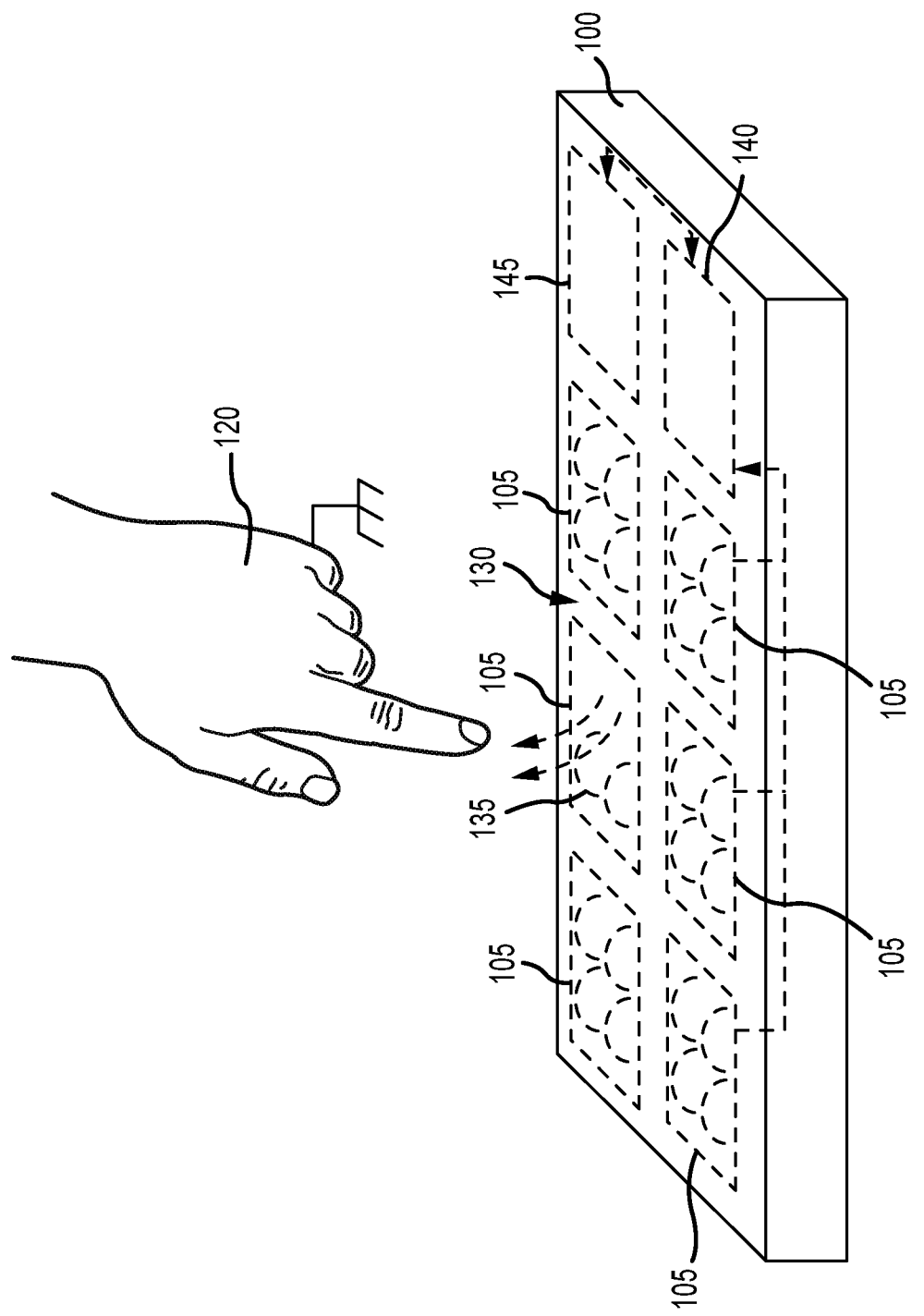

2016/0041653 A1 2/2016 Schediwy
2016/0188082 A1* 6/2016 Ham .................... G06F 3/0416
                                                    345/174
2016/0342000 A1 11/2016 Tamura

* cited by examiner

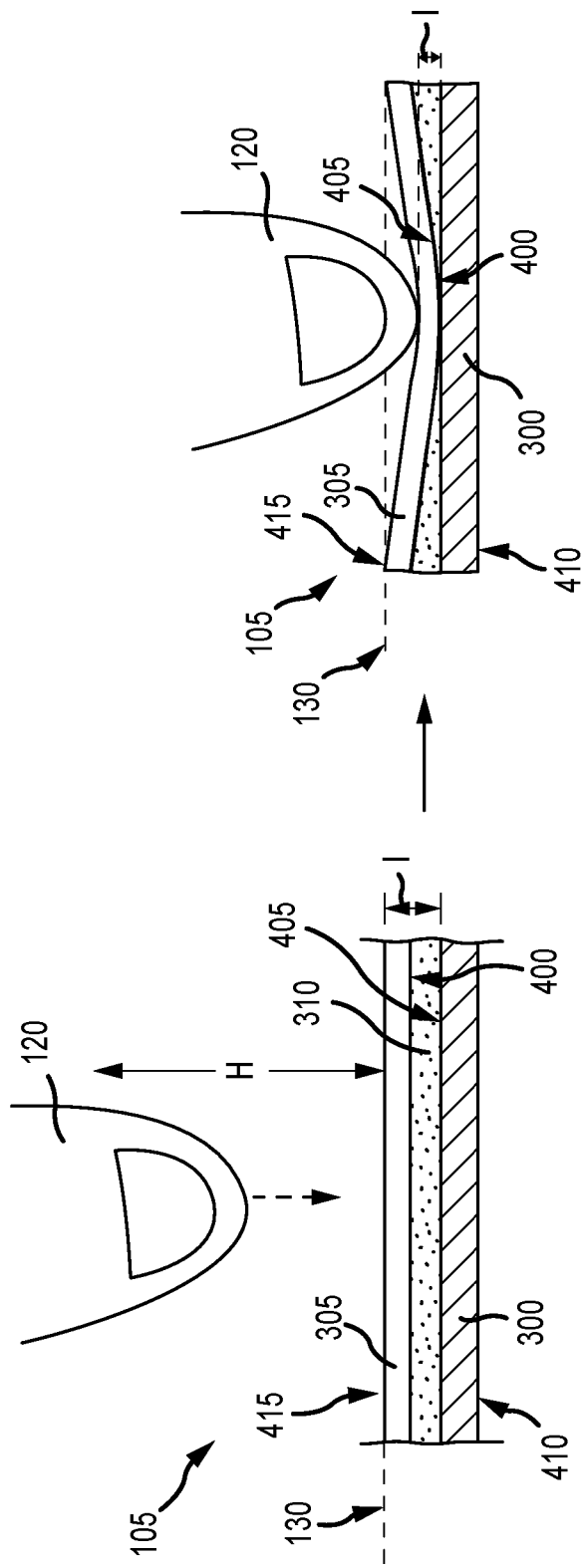

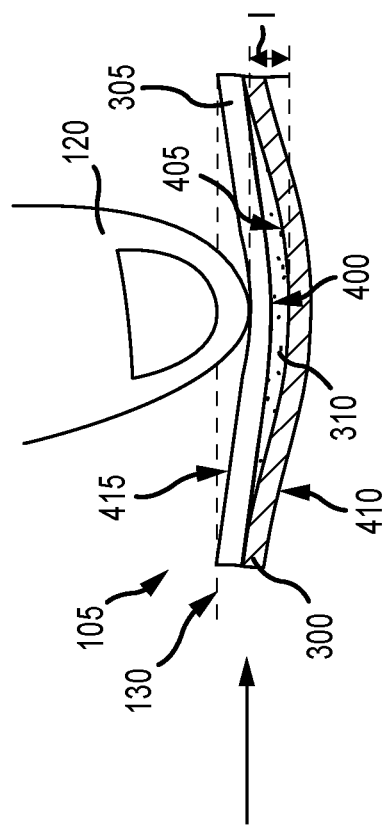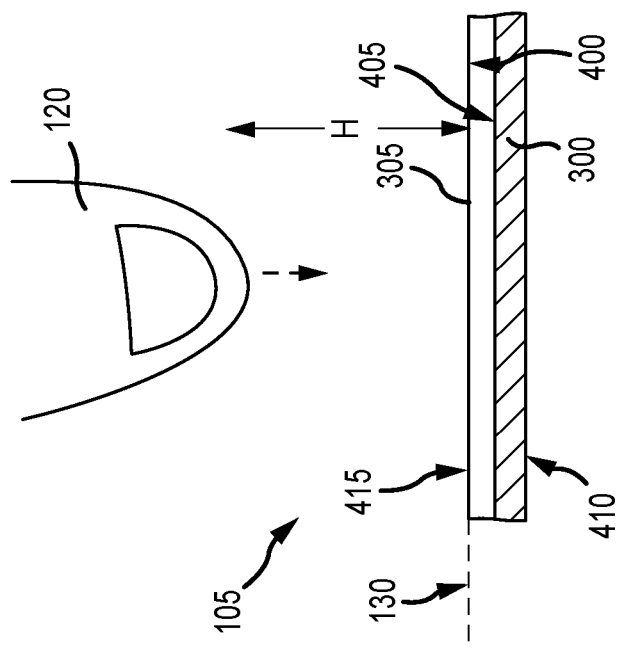

METHODS AND APPARATUS FOR A CAPACITIVE PRESSURE SENSOR

CROSS-REFERENCE TO RELATED APPLICATION

This application is a continuation of U.S. patent application Ser. No. 15/647,438, filed on Jul. 12, 2017, and incorporates the disclosure of the application in its entirety by reference.

BACKGROUND OF THE TECHNOLOGY

Capacitive sensors operate by detecting changes in the capacitance formed between a transmission electrode and a sense electrode. A sensing circuit can recognize an object and determine the location, pressure, direction, speed and acceleration of the object as it is approaches and/or moves across the touch surface.

Electronic devices with touch sensing surfaces may utilize various capacitive sensing devices to allow a user to make selections and move objects by moving their finger (or stylus) relative to a capacitive sensing element. The capacitive sensing device may utilize mutual capacitive sensing or self-capacitance sensing. Mutual capacitance touch sensors not only have the ability to detect touch events on the sensing surface, but also have the ability to detect proximity events, in which an object is not touching the sensing surface, but is in close proximity to the sensing surface. The mutual capacitive touch sensor operates by measuring the capacitance of the capacitive sense element, and looking for a change in capacitance indicating a touch or presence of a conductive object. When the conductive object (e.g., a finger, hand, foot, or other object) comes into contact or close proximity with a capacitive sense element, the capacitance changes and the conductive object is detected. An electrical circuit may be utilized to measure the change in capacitance of the capacitive touch sense element, and the electrical circuit may convert the measured capacitance of the capacitive sense element into a digital value.

Conventional devices that are capable of both proximity and touch sensing must generally rely on additional pressure sensors and/or a resistance film sensor to detect when a firm pressure is applied to the sensing surface, which may increase the overall cost of the device.

SUMMARY OF THE INVENTION

Various embodiments of the present technology may comprise methods and apparatus for a capacitive pressure sensor configured to detect firm pressure. The capacitive pressure sensor may comprise a first substrate and a second substrate, wherein at least one of the first and second substrate is configured to deform when firm pressure is applied. The deformation of the sensor may either create an air gap between the substrates or eliminate an air gap between the substrates. The deformation may be interpreted as firm pressure to the sensor.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

Figure 2:
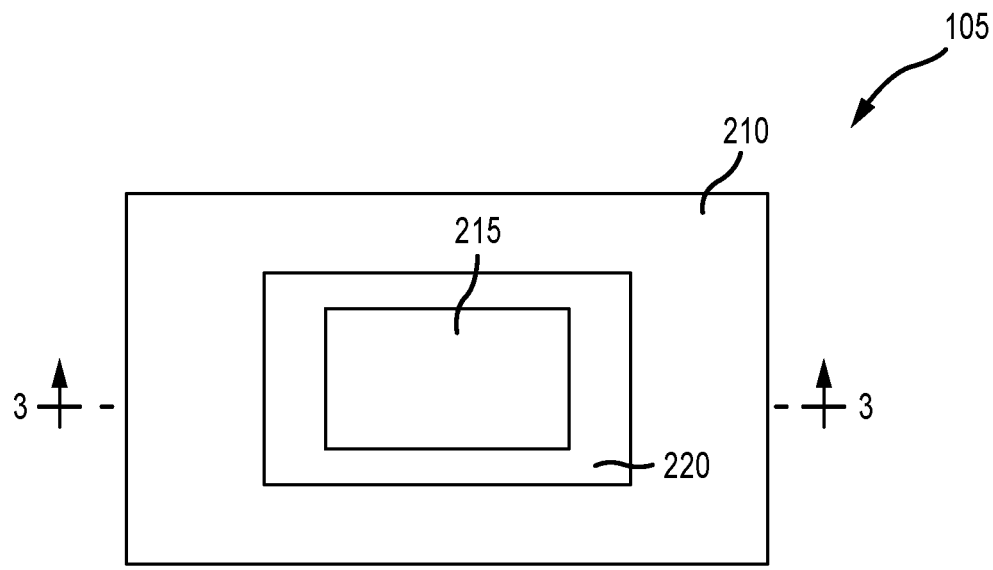
Figure 3:
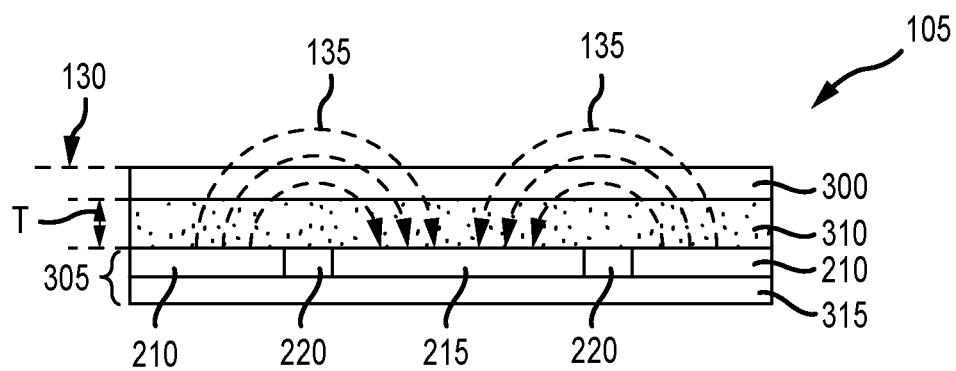
Figure 4:
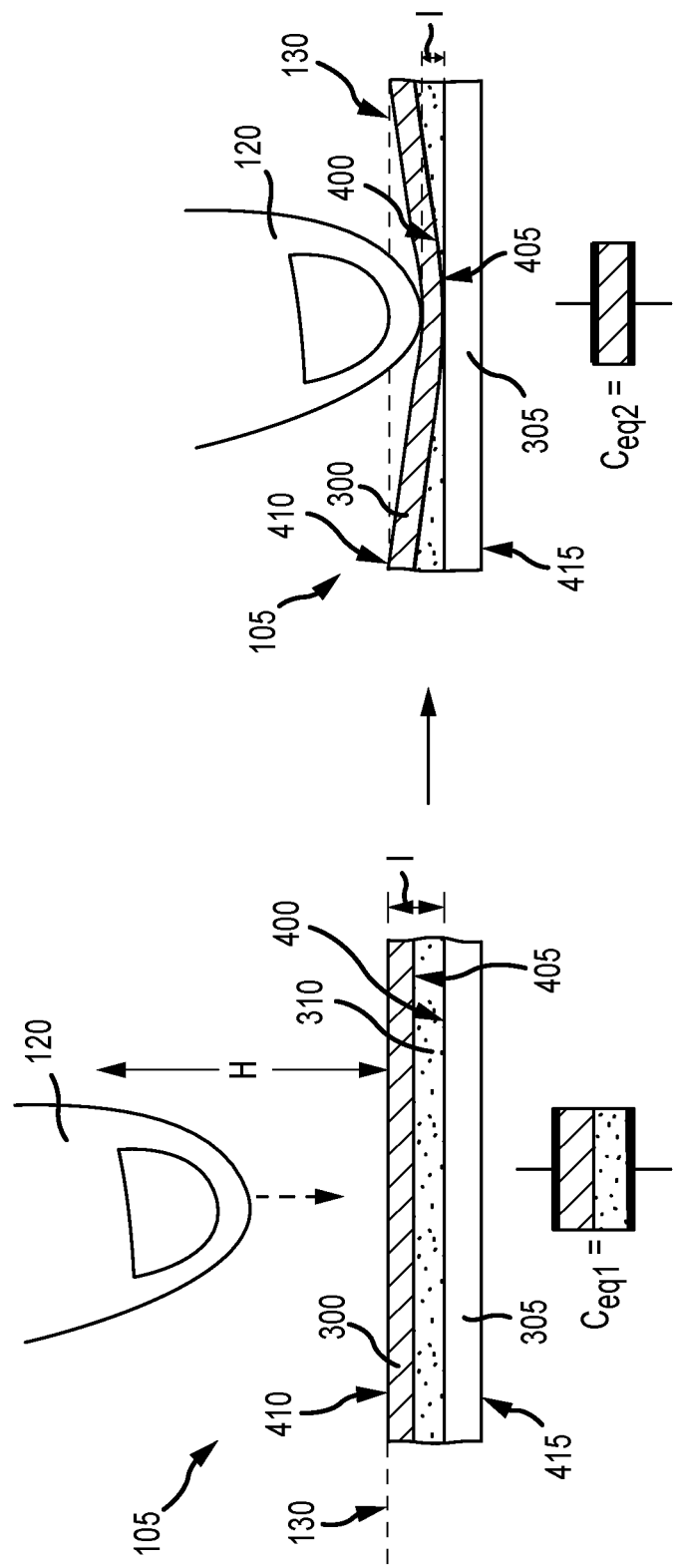
Figure 5:
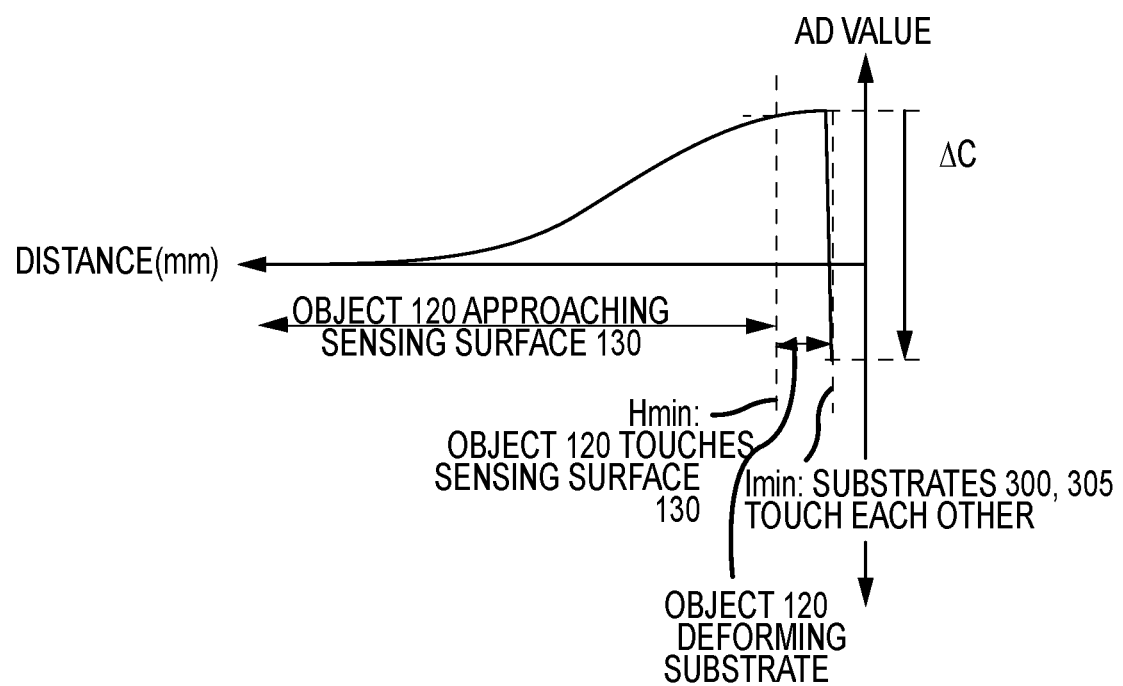
Figure 6:
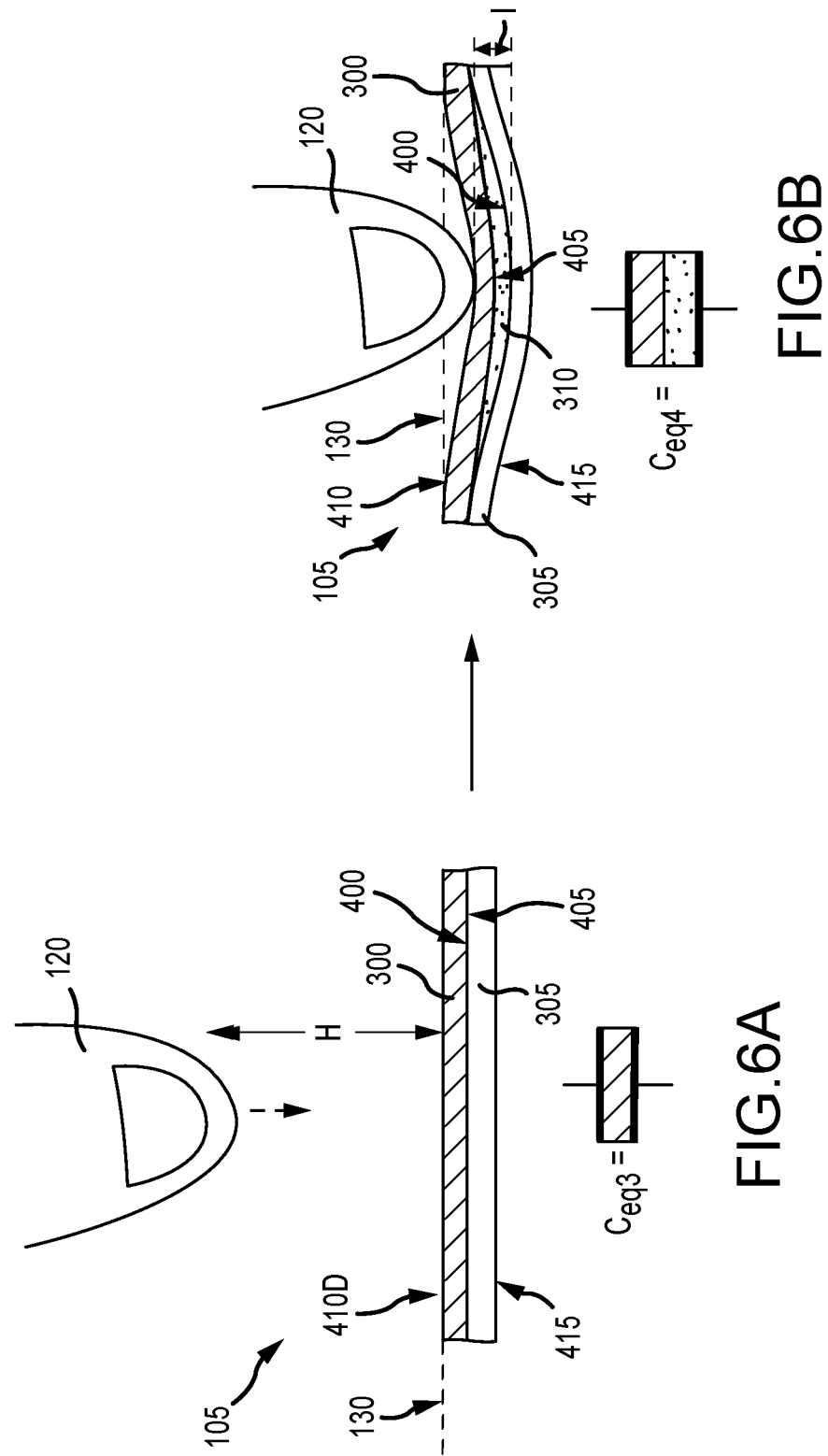
Figure 7:
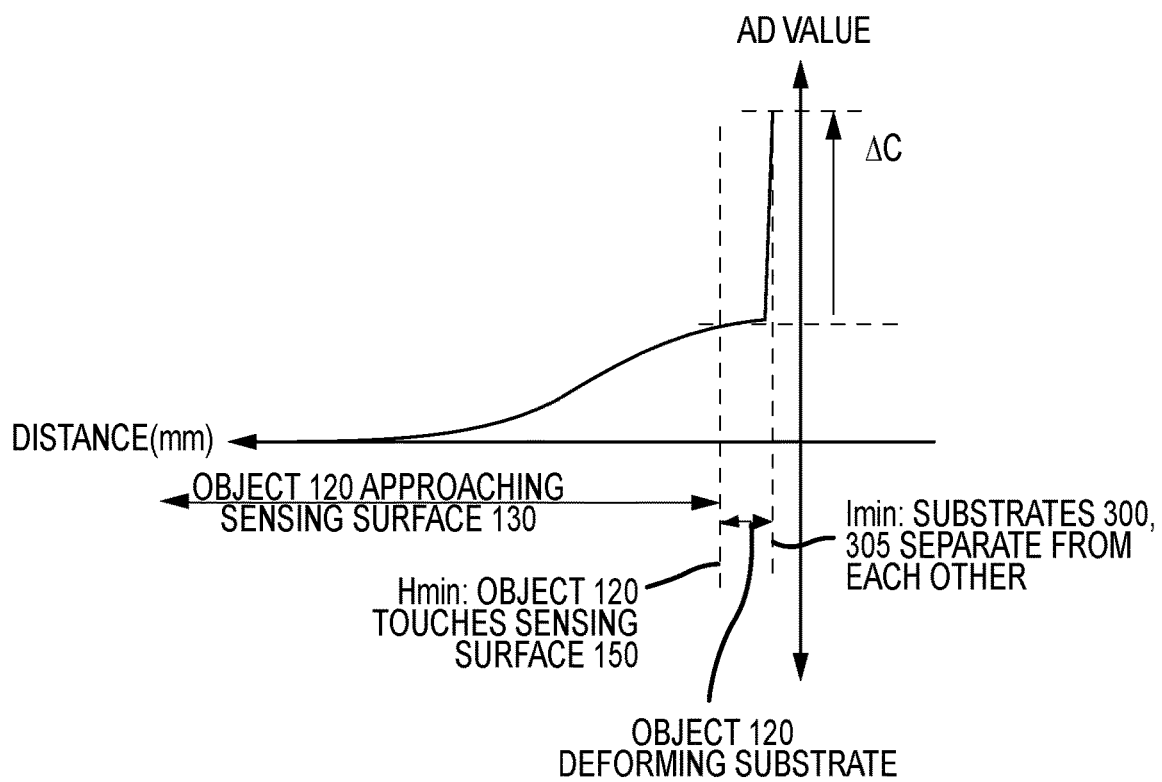
Figure 8A:
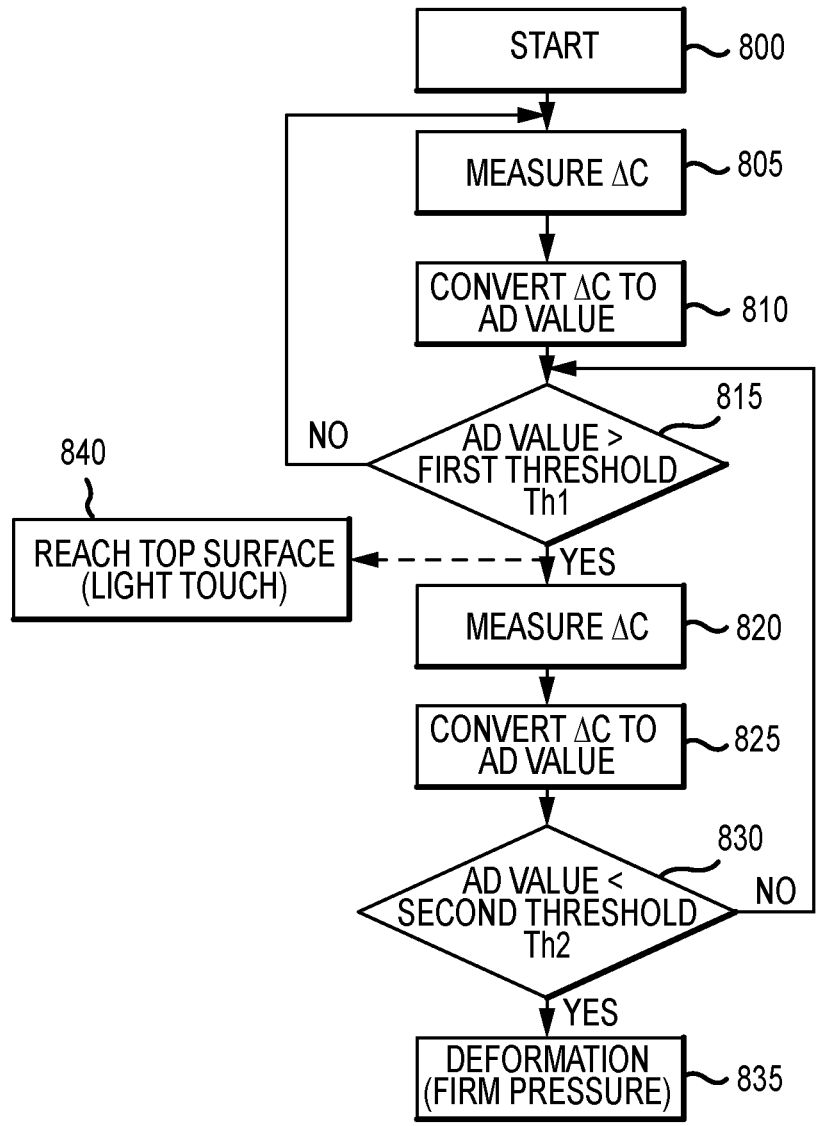
Figure 8B:
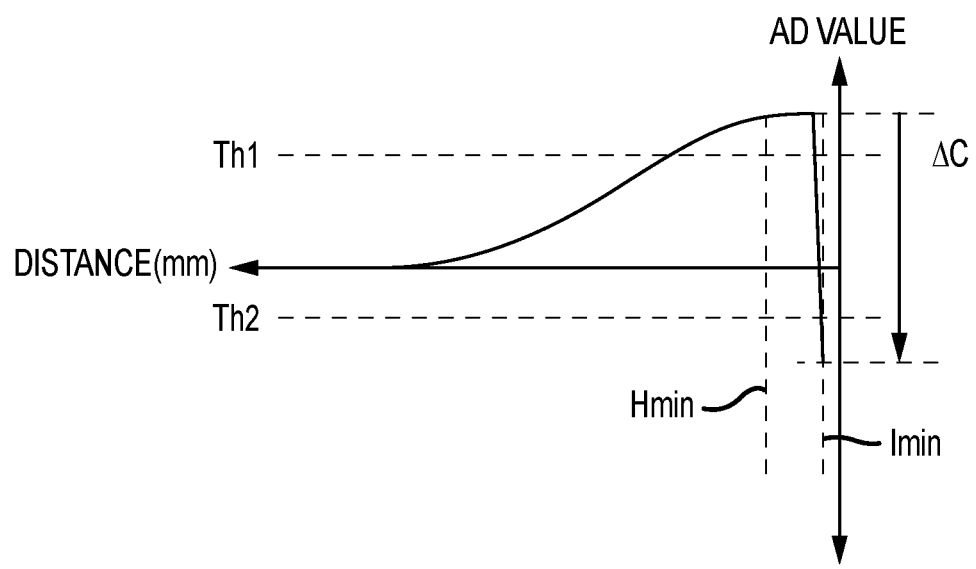

FIG. 1 representatively illustrates an electronic device featuring a touch system in accordance with an exemplary embodiment of the present technology;

FIG. 2 representatively illustrates a top view of a capacitive sensor in accordance with an exemplary embodiment of the present technology;

FIG. 3 representatively illustrates a cross-sectional view of the capacitive sensor of FIG. 2 in accordance with an exemplary embodiment of the present technology;

FIGS. 4A and 4B representatively a capacitive sensor in accordance with one embodiment of the present technology;

FIG. 5 graphically illustrates an output value of the capacitive sensor of FIGS. 4A and 4B;

FIGS. 6A and 6B representatively illustrate a capacitive sensor in accordance with an alternative embodiment of the present technology;

FIG. 7 graphically illustrates an output value of the capacitive sensor of FIGS. 6A and 6B;

FIG. 8A is a flowchart for operating the capacitive sensor of FIGS. 4A and 4B;

FIG. 8B graphically illustrates operation thresholds according to the flowchart of FIG. 8A.

Figure 9A:
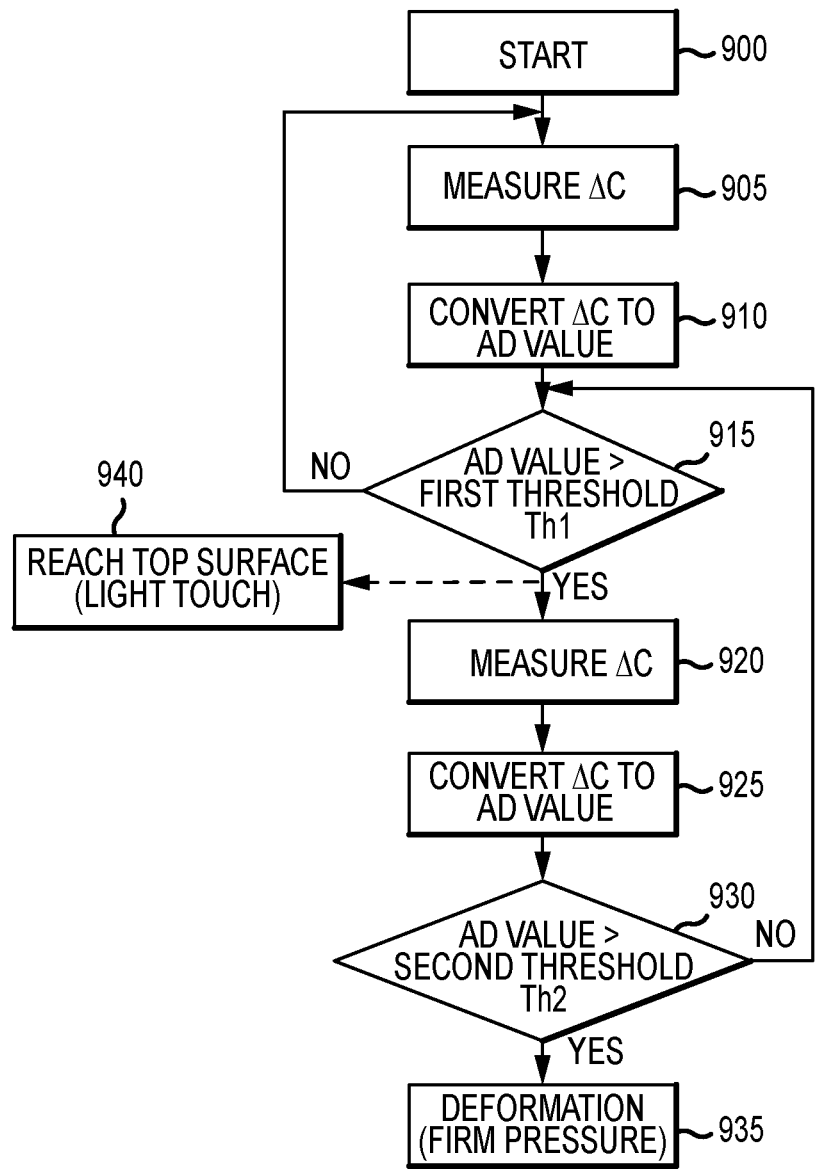
Figure 9B:
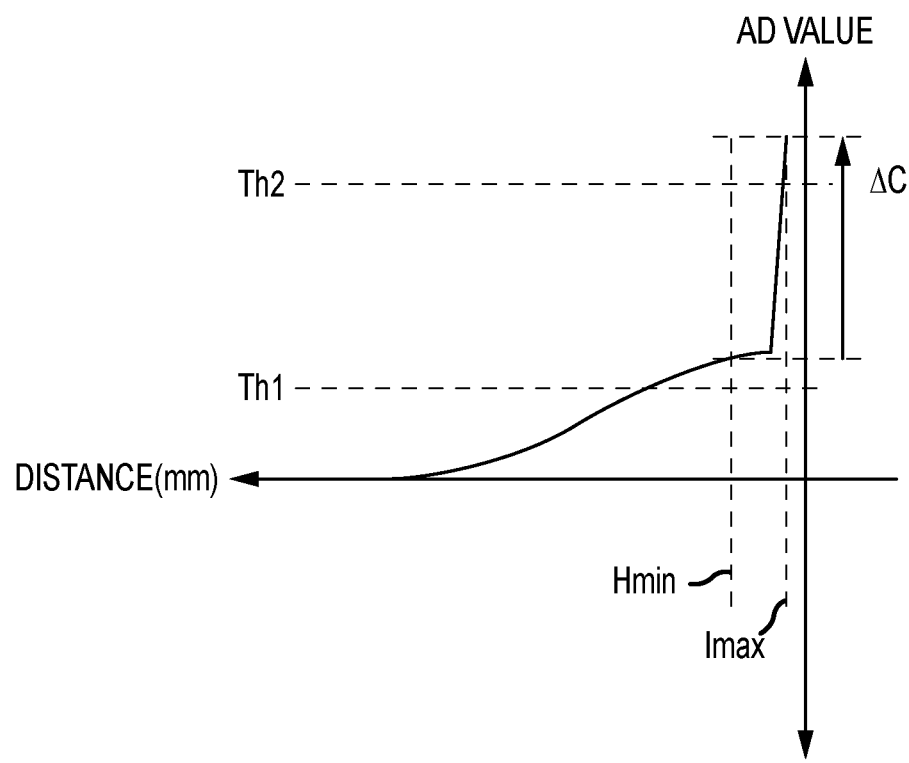
Figure 10:
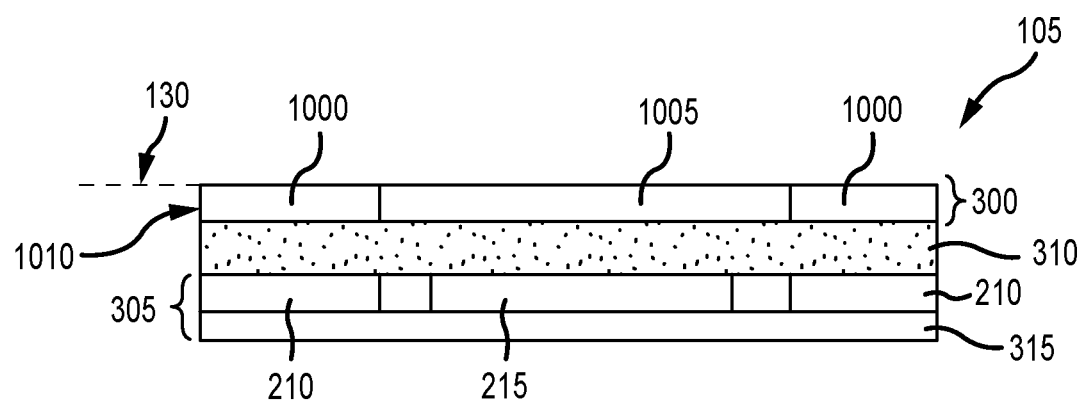

FIG. 9A is a flowchart for operating the capacitive sensor of FIGS. 6A and 6B;

FIG. 9B graphically illustrates operation thresholds according to the flowchart of FIG. 9A;

FIG. 10 representatively illustrates an alternative cross-sectional view of the capacitive sensor of FIG. 2 in accordance with an exemplary embodiment of the present technology;

FIGS. 11A and 11B representatively illustrate the capacitive sensor of FIG. 4 in an alternative position; and FIGS. 12A and 12B representatively illustrate the capacitive sensor of FIG. 6 in an alternative position.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various controllers, amplifiers, signal converters, drivers, switching devices, current sources, logic gates, semiconductor devices, such as transistors, capacitors, and the like, which may carry out a variety of functions. In addition, the present technology may be integrated in any number of electronic systems, such as automotive, aviation, "smart devices," portables, "white goods," and consumer electronics, and the systems described are merely exemplary applications for the technology. Further, the present technology may employ any number of conventional techniques for voltage-to-time conversion and time-to-digital conversion.

Referring to FIGS. 1, 2, and 3, an electronic device 100, such as a cellular phone, personal computer, and the like, may detect an object 120, such as a human fingertip, a pen point, or the like, within a proximity to the device, touching the device, and detecting pressure (or force or weight) on a sensing surface 130 of the device 100. For example, the electronic device 100 may comprise a plurality of capacitive sensors 105, wherein each is configured as a mutual capacitance sensor. According to various embodiments, each capacitive sensor 105 may generate an electric field 135 above the sensing surface 130 of the electronic device 100. For example, the capacitive sensor 105 may comprise a first electrode 210, such as a drive electrode, and second electrode 215, such as a reception electrode, capable of forming the electric field 135. The first and second electrodes 210, 215 may be formed using a conductive material, such as metal, and the first electrode 210 may be coupled to a power source that pulses between two voltage levels to generate a drive signal.

According to various embodiments, the electronic device may comprise any number of capacitive sensors 105 arranged in any suitable pattern. For example, one or more capacitive sensors 105 may form various input elements of the electronic device, such as buttons, switches, dials, sliders, keys or keypads.

The electronic device 100 may further comprise a measurement circuit 140 responsive to the electric field 135 and configured to measure a change in capacitance value of the capacitive sensor 105. For example, as the object 120 enters the electric field 135, the electric field 135 is disrupted resulting in a change in the capacitance of the capacitive sensor 105. The closer the object 120 is to the sensing surface 130 the more the electric field 135 is disrupted. Accordingly, the object 120 may not need to physically touch the sensing surface 130 to effect a change in the capacitance. The measurement circuit 140 may convert the measured capacitance to an AD value (i.e., a digital value). In various embodiments, as the object 120 approaches the sensing surface 130 of the device 100, the capacitance of the capacitive sensor 105 decreases and the corresponding AD values increases. In various embodiments, the measurement circuit 140 may be coupled to multiple capacitive sensors 105 and configured to measure the capacitance of each capacitive sensor as the object 120 moves between the electric fields of the corresponding capacitive sensors.

The electronic device 100 may further comprise a logic unit 145 responsive to the measurement circuit 140. For example, the logic unit 145 may receive the AD values from the measurement circuit 140, interpret the values, and perform an appropriate response and/or produce an appropriate output signal. According to various embodiments, the logic unit 145 may be programmed with a predetermined threshold that corresponds to a particular AD value and a corresponding amount of pressure applied to the sensing surface 130. The logic unit 145 may utilize the predetermined threshold to detect the amount of applied pressure. For example, the logic unit 145 may compare the predetermined threshold to the AD value to determine whether the object 120 has applied a firm pressure (firm touch) or a light touch to the sensing surface 130. According to various embodiments, a light touch to the sensing surface 130, which has no deforming effect on the sensing surface 130, may be described as applying a pressure of approximately 1-2 ounces per square inch (430.9-861.4 Pascals) to the sensing surface 130, while a firm touch, which deforms the sensing surface 130, may be described as any pressure value above 861 Pa. The logic unit 145 may generate an output signal corresponding to the outcome of the comparison. For example, according to various embodiments, a large positive AD value may correspond to firm pressure. In alternative embodiments, a large negative AD value may correspond to firm pressure.

Referring to FIGS. 2, 3, 4A, and 4B, the capacitive sensor 105 may comprise a first substrate 300 and a second substrate 305. The first and second substrates 300, 305 may comprise various layers of conductive and non-conductive materials. The first substrate 300 comprises a first surface 405 and a second surface 410, and the second substrate 305 comprises a first surface 400 and a second surface 415.

According to various embodiments, at least one of the first and second substrates 300, 305 is configured to deform (e.g., bend, bow, buckle, or otherwise alter the shape) when firm pressure is applied to the sensing surface 130. The deformation of the first substrate 300 and/or the second substrate 305 may either create a gap 310 between the substrates or eliminate the gap 310 between the first and second substrates 300, 305.

According to various embodiments, the gap 310 allows the capacitance of the capacitive sensor 105 to change according to a distance T between the first and second substrates 300, 305. The gap 310 may comprise a dielectric layer and/or other material capable of compression and/or dispersion when pressure is applied. For example, according to various embodiments, the gap 310 may comprise gas, liquid, gel, foam, or any other suitable material. According to various embodiments, the first and second substrates 300, 305 are separated by the gap 310 prior to applying pressure. For example, the first surface 405 of the first substrate 300 and the first surface 400 of the second substrate 305 may be separated by the gap 310.

According to an alternative embodiment, and referring to FIGS. 6A-B, the first and second substrates 300, 305 may be in contact with each other prior to applying pressure to the sensing surface 130, for example the first and second substrates 300, 305 may be stacked vertically, wherein the first surface 405 of the first substrate 300 abuts the first surface 400 of the second substrate 305.

According to one embodiment, and referring to FIGS. 3 and 4A-B, the first substrate 300 may comprise a first material with a first dielectric constant $k_1$. The first substrate 300 may comprise a protective material, such as a flexible plastic, resin, polymer, or any other material suitable to provide a protective cover to the second substrate 305. In some embodiments, and referring to FIG. 10, the first substrate 300 may comprise a flexible portion 1000 and a rigid portion 1005 coplanar with each other. The flexible portion 1000 may be positioned adjacent to an edge 1010 of the capacitive sensor 105 with the rigid portion 1005 positioned proximate to the second electrode 215.

Referring to FIGS. 3 and 4A-B, the second substrate 305 may be configured to provide electrical interconnects and generate the electric field 135. For example, the second substrate 305 may comprise the first electrode 210 and the second electrode 215. In various embodiments, the first electrode 210 and the second electrode 215 may be coplanar with each other and formed on a shared substrate layer. In alternative embodiments, the first electrode 210 may be formed on one layer, while the second electrode 215 may be formed on a different layer.

The second substrate 305 may further comprise a PCB (printed circuit board) 315 configured to mechanically support and electrically connect various electrical components using conductive tracks, pads, and the like. In various embodiments, the first electrode 210 and the second electrode 215 may be formed on the PCB 315.

According to various embodiments, the position of the capacitive sensor 105 relative to the sensing surface 130 may be selected according to the particular application. For example, and referring to FIGS. 4A and 6A, the second surface 410 of the first substrate 300 may form the sensing surface 130. Alternatively, and referring to FIGS. 11A and 12A, the capacitive sensor 105 may be flipped 180 degrees, such that the second surface 415 of the second substrate 305 forms the sensing surface 130. In each case, the sensing surface 130 is defined as an outer region and/or an exterior surface of the electronic device 100 that is suitable for contact with the object 120.

According to one embodiment, and referring to FIGS. 4A-B, prior to deformation, the capacitive sensor 105 may be represented with a first equivalent capacitance $C_{eq1}$, where the first equivalent capacitance is illustrated as two parallel plates separated by a first material with the first dielectric constant $k_1$ (e.g., the first substrate 300) and a second material with a second dielectric constant $k_2$, such as air, disposed between the parallel plates. As the object 120 applies firm pressure to the sensing surface 130, the first substrate 300 is deformed towards the second substrate 305. When the first substrate 300 is deformed enough that the first substrate 300 contacts the second substrate 305, the capacitive sensor 105 now has a second equivalent capacitance $C_{eq2}$ represented by two parallel plates separated only by the first material with the first dielectric constant k1. Since the capacitance of the capacitive sensor 105 is based on the dielectric constants $k_1$, $k_2$ of the first and second materials, the second equivalent capacitance $C_{eq2}$ has a higher capacitance than the first equivalent capacitance $C_{eq1}$. For example, the first equivalent capacitance $C_{eq1}$ may be given by: $C_{eq1}=C_M*C_A/(C_M+C_A)$, where $C_M$ is the capacitance of the first material and $C_A$ is the capacitance of the second material. If $C_M=2$ pF and $C_A=1$ pF, then $C_{eq1}=0.67$ pF. The second equivalent capacitance $C_{eq2}$ may be given by $C_{eq2}=C_M$. Therefore, $C_{eq2}=2$ pF. The change in capacitance ($\Delta C$) from the first equivalent capacitance $C_{eq1}$ to the second equivalent capacitance $C_{eq2}$ is measurable, for example as illustrated in FIG. 5.

Conversely, according to an alternative embodiment, and referring to FIGS. 6A-B, prior to deformation, the capacitive sensor 105 may be represented with a third equivalent capacitance $C_{eq3}$, where the third equivalent capacitance is illustrated as two parallel plates separated by the first material with the first dielectric constant $k_1$ situated between the parallel plates. As the object 120 applies firm pressure to the sensing surface 130 and the capacitive sensor 105, the first and second substrates 300, 305 are deformed. When the first and second substrates 300, 305 reach a maximum deformation, the capacitive sensor 105 now has a fourth equivalent capacitance $C_{eq4}$ represented by two parallel plates separated by the first material with the first dielectric constant $k_1$ (e.g., the first substrate 300) and the second material with the second dielectric constant $k_2$, such as air, disposed between the parallel plates. Since the capacitance of the capacitive sensor 105 is based on the dielectric constants $k_1$, $k_2$ of the first and second materials, the fourth equivalent capacitance $C_{eq4}$ is less than the third equivalent capacitance $C_{eq3}$. For example, the third equivalent capacitance $C_{eq3}$ may be given by: $C_{eq3}=C_M$. Therefore, $C_{eq3}=2$ pF. The fourth equivalent capacitance $C_{eq4}$ may be given by: $C_{eq4}=C_M*C_A/(C_M+C_A)$, where $C_M$ is the capacitance of the first material and $C_A$ is the capacitance of the second material. If $C_M=2$ pF and $C_A=1$ pF, then $C_{eq4}=0.67$ pF. The change in capacitance ($\Delta C$) from the third equivalent capacitance $C_{eq3}$ to the fourth equivalent capacitance $C_{eq4}$ is measurable, for example as illustrated in FIG. 7.

It should be noted that the equivalent capacitances described above are meant to provide a simplistic representation of the capacitance of the capacitive sensor 105. The particular dimensions and arrangement of the first and second electrodes 210, 215 (FIG. 3), among other factors, will also influence the capacitance of the capacitive sensor 105.

According to various embodiments, in operation, the electronic device 100 detects when the object 120 approaches the sensing surface 130, detects when the object 120 touches the sensing surface 130, and detects when the object 120 applies firm pressure to the sensing surface 130. In various embodiments, when the object 120 applies firm pressure to the sensing surface 130, the capacitive sensor 105 deforms causing a detectable change in the capacitance of the sensor 105. According to various embodiments, the amount of pressure required to deform the capacitive sensor may be based on the type and/or thickness of material used to form the first and second substrates 300, 305.

Referring to FIGS. 1, 4A-B and 5, as the object 120 approaches, such as when a person's finger gets close to the sensing surface 130, some of the electric field 135 is absorbed by the object 120, decreasing the amount of energy stored in the capacitive sensor 105 and thus reducing the capacitance. As the object 120 moves closer to the sensing surface 130, more of the electric field 135 is absorbed by the object 120 and the capacitance may continue to decrease, which corresponds to an increasing AD value. As the AD value changes according to the change in capacitance of the capacitive sensor 105, it may be possible to quantify or otherwise estimate a distance H between the object 120 and the sensing surface 130.

The object 120 may continue to approach the sensing surface 130 until the object 120 reaches a minimum distance $H_{min}$, which is reached when the object 120 contacts the sensing surface 130. As the object 120 increases the pressure on the sensing surface 130 (e.g., the second surface 410 of the first substrate 300), the first substrate 300 begins to deform (e.g., bend). The object 120 may continue to apply firm pressure to the capacitive sensor 105 until the object 120 reaches a minimum internal distance $I_{min}$, resulting in a sharp decrease in the AD value, which is reached when the first substrate 305 contacts the second substrate 305, or vice versa. As the AD value changes according to the change in capacitance of the capacitive sensor 105, it may be possible to quantify or otherwise estimate an internal distance I between the sensing surface 130 formed by one substrate (e.g., the second surface 410 of the first substrate 300) and an opposing substrate (e.g., the first surface 400 of the second substrate 305).

Referring to FIGS. 1, 6A-B, and 7, in an alternative embodiment, the capacitive sensor 105 may detect the proximity of the object 120 to the sensing surface 130 and contact with the sensing surface 130, as described above. As the object 120 applies firm pressure to the sensing surface 130, the capacitive sensor 105 deforms, resulting in a sharp increase in the AD value. As the AD value changes according to the change in capacitance of the capacitive sensor 105, it may be possible to quantify or otherwise estimate the internal distance I between the sensing surface 130 formed by one substrate (e.g., the second surface 410 of the first substrate 300) and an opposing substrate (e.g., the first surface 400 of the second substrate 305). The object 120 may continue to apply firm pressure to the capacitive sensor 105 until the object 120 reaches a maximum internal distance $I_{max}$, which is reached when the gap 310 forms between the first substrate 300 and the second substrate 305 (i.e., the first substrate 300 separates from the second substrate 305).

Referring to FIGS. 1 and 8A-B, in one operation where one of the first substrate 300 and second substrate 305 (e.g., as illustrated in FIG. 4B) is capable of deforming, as the object 120 approaches, touches, and applies firm pressure to the sensing surface 130 (800), the measurement circuit 140 may measure the change in capacitance (ΔC) of the capacitive sensor 105 (805). The measurement circuit 140 may then convert the change in capacitance to the AD value and transmit the AD value to the logic unit 145 (810). The logic unit 145 may then determine if the AD value is greater than a first threshold TH1 (815) by comparing the two values. If the AD value is not greater than the first threshold TH1, then the measurement circuit 140 and logic unit 145 continue to the measure the change in capacitance (805), convert the change in capacitance to the AD, and compare the AD value to the first threshold TH1 until the AD value is greater than the first threshold TH1. If the AD value is greater than the first threshold TH1, then the logic unit 145 may interpret this as a light touch to the sensing surface 130 by the object 120 (820). The logic unit 145 may generate and output a touch signal to a host processor, central processing unit, or the like, to control and/or employ various aspects and/or functions of the device 100.

The measurement circuit 140 may continue to measure the change in capacitance (820) and convert the capacitance to an AD value (825). The logic unit 145 may then determine if the AD value is less than a second threshold TH2 (830) by comparing the two values. If the AD value is not less than the second threshold TH2, then the measurement circuit 140 continues to the measure the capacitance, and the logic unit 145 interprets the AD value to determine if the object 120 is moving away from or still contacting the sensing surface. If the AD value is less than the second threshold TH2, then the logic unit 145 may interpret this as deformation of the capacitive sensor 105, which indicates firm pressure to the sensing surface 130 by the object 120 (835). The logic unit 145 may generate and output a pressure signal to a host processor, central processing unit, or the like, to control and/or employ various aspects and/or functions of the device 100.

Referring to FIGS. 1 and 9A-B, in an alternative operation where both the first and second substrates 300, 305 (e.g., as illustrated in FIG. 6B) are capable of deforming, as the object 120 approaches, touches, and applies firm pressure to the sensing surface 130 (900), the measurement circuit 140 may measure the change in capacitance (ΔC) of the capacitive sensor 105 (905). The measurement circuit 140 may then convert the change in capacitance to the AD value and transmit the AD value to the logic unit 145 (910). The logic unit 145 may then determine if the AD value is greater than a first threshold TH1 (915). If the AD value is not greater than the first threshold TH1, then the measurement circuit 140 and logic unit 145 continue to the measure the change in capacitance (905), convert the change in capacitance to the AD, and compare the AD value to the first threshold TH1 until the AD value is greater than the first threshold TH1. If the AD value is greater than the first threshold TH1, then the logic unit 145 may interpret this as a light touch to the sensing surface 130 by the object 120 (920). The logic unit 145 may generate and output a touch signal to a host processor, central processing unit, or the like, to control and/or employ various aspects and/or functions of the device 100. The measurement circuit 140 may continue to measure the change in capacitance (920) and convert the capacitance to an AD value (925). The logic unit 145 may then determine if the AD value is greater than a second threshold TH2 (930). If the AD value is not greater than the second threshold TH2, then the measurement circuit 140 continues to the measure the capacitance, and the logic unit 145 interprets the AD value to determine if the object 120 is moving away from or still contacting the sensing surface. If the AD value is greater than the second threshold TH2, then the logic unit 145 may interpret this as deformation of the capacitive sensor 105, which indicates firm pressure to the sensing surface 130 by the object 120 (835). The logic unit 145 may generate and output a pressure signal to a host processor, central processing unit, or the like, to control and/or employ various aspects and/or functions of the device 100.

According to various embodiments, when the logic unit 145 interprets the AD value as corresponding to proximity, light touch and, firm pressure and transmits the respective signal to the host processor (not shown), the electronic device 100 may then respond and/or operate in a particular manner. The particular response to the proximity signal, touch signal, and pressure signal may be based on the particular application.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A capacitive sensor, comprising:
a first substrate, having a first surface; and
a second substrate, having a first surface directly adjacent to the first surface of the first substrate, comprising:
  a capacitor comprising:
    a first electrode; and
    a second electrode positioned substantially coplanar with the first electrode;
      wherein the first electrode and the second electrode form a capacitance;
  wherein at least one of the first substrate and the second substrate is capable of deforming in response to an applied first pressure to produce a first change in the capacitance and the first and second substrates deform under the applied first pressure to create a gap between at least a portion of the first and second substrates.

2. The capacitive sensor according to claim 1, wherein the first and second substrates are configured to deform when the first pressure is applied to a second surface of the first substrate.

3. The capacitive sensor according to claim 1, wherein the first and second substrates are configured to deform when the first pressure is applied to a second surface of the second substrate.

4. The capacitive sensor according to claim 1, wherein:
the first substrate maintains its shape under an applied second pressure;
the second substrate maintain its shape under the applied second pressure; and
the applied second pressure produces a second change in the capacitance.

5. The capacitive sensor according to claim 1, wherein the first and second substrates are arranged in a vertically-stacked orientation.

6. The capacitive sensor according to claim 1, wherein:
the second electrode is nested within an interior region formed by the first electrode; and
the first and second electrodes are separated by a gap.

7. The capacitive sensor according to claim 1, wherein the first substrate, comprises:
a flexible portion disposed along an outer edge of the capacitive sensor; and
a rigid portion within an interior region formed by the flexible portion; and
wherein the rigid and flexible portions are coplanar with each other.

8. A method for detecting an applied pressure, comprising:
providing a capacitive sensor comprising:
  a first substrate; and
  a second substrate abutting the first substrate;
  wherein:
    the second substrate comprises a first electrode coplanar with a second electrode;
    the first and second electrodes form a capacitance; and
    at least one of the first substrate and second substrate is capable of deforming in response to the applied pressure;
generating an electric field between the first and second electrodes;
measuring a change in the capacitance of the capacitive sensor; and
utilizing the measured change in the capacitance to determine:
  an applied first pressure; and
  an applied second pressure.

9. The method according to claim 8, wherein the second electrode is nested within a region defined by the first electrode.

10. The method according to claim 8, wherein utilizing the measured change in capacitance to determine the first and second applied pressures comprises:
converting the change in capacitance to a digital value;
comparing the digital value to a first threshold;
generating a first signal based on the comparison of the digital value to the first threshold, wherein the first signal indicates the first applied pressure;
comparing the digital value to a second threshold; and
generating a second signal based on the comparison of the digital value to the second threshold, wherein the second signal indicates the second applied pressure.

11. The method according to claim 8, wherein:
the applied first pressure corresponds to zero change in distance between the first and second substrates; and
the applied second pressure corresponds to a change in distance between the first and second substrates that is greater than zero.

12. The method according to claim 8, wherein the second pressure is greater than 861 Pascals.

13. The method according to claim 8, wherein the first and second substrates are arranged in a vertically-stacked orientation.

14. A capacitive sensor, comprising:
a first substrate, having a first surface; and
a second substrate, having a first surface adjacent to the first surface of the first substrate, comprising:
  a capacitor comprising:
    a first electrode; and
    a second electrode positioned substantially coplanar with the first electrode;
      wherein the first electrode and the second electrode form an intentional capacitance, at most, with each other;
  wherein:
    a first gap is disposed between the first and second substrates;
    the second substrate deforms under a first applied pressure to a second surface of the second substrate and reduces at least a portion of the first gap between the first and second substrates; and
    the first substrate maintains its shape under the applied pressure.

15. The capacitive sensor according to claim 14, wherein the first and second substrates are arranged in a vertically-stacked orientation.

16. The capacitive sensor according to claim 14, wherein:
the second electrode is nested within an interior region formed by the first electrode; and
the first and second electrodes are separated by a second gap.

17. The capacitive sensor according to claim 14, wherein the first gap is filled with air.

18. The capacitive sensor according to claim 14, wherein the first gap is filled with one of: a liquid, a gel, and a foam.

19. The capacitive sensor according to claim 14, wherein the first substrate comprises:
- a flexible portion disposed along an outer edge of the capacitive sensor; and
- a rigid portion within an interior region formed by the flexible portion; and
- wherein the rigid and flexible portions are coplanar with each other.

* * * * *